US009929742B2

(12) United States Patent
Tsai

(10) Patent No.: US 9,929,742 B2
(45) Date of Patent: Mar. 27, 2018

(54) FEED-FORWARD OPERATIONAL AMPLIFIER NOISE CANCELLATION TECHNIQUE AND ASSOCIATED FILTER AND DELTA-SIGMA MODULATOR

(71) Applicant: MEDIATEK INC., Hsin-Chu (TW)

(72) Inventor: Hung-Chieh Tsai, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/652,207

(22) Filed: Jul. 17, 2017

(65) Prior Publication Data
US 2018/0054213 A1    Feb. 22, 2018

Related U.S. Application Data

(60) Provisional application No. 62/375,921, filed on Aug. 17, 2016.

(51) Int. Cl.
| | |
|---|---|
| H03M 3/00 | (2006.01) |
| H03F 3/45 | (2006.01) |
| H03F 1/26 | (2006.01) |
| H03G 3/20 | (2006.01) |

(52) U.S. Cl.
CPC ............. *H03M 3/368* (2013.01); *H03F 1/26* (2013.01); *H03F 3/45475* (2013.01); *H03M 3/422* (2013.01); *H03M 3/436* (2013.01); *H03M 3/458* (2013.01); *H03F 2200/411* (2013.01); *H03F 2203/45116* (2013.01); *H03G 3/20* (2013.01)

(58) Field of Classification Search
CPC ...... H03M 3/458; H03M 3/422; H03M 3/436; H03F 1/26; H03F 3/45475; H03F 2200/411; H03F 2203/45116; H03G 3/20

USPC ................................................ 341/118, 143
See application file for complete search history.

(56) References Cited

U.S. PATENT DOCUMENTS

| | | |
|---|---|---|
| 3,980,967 A | 9/1976 | Seidel |
| 4,276,514 A | 6/1981 | Huang |
| 4,523,152 A | 6/1985 | Garde |
| 4,571,553 A | 2/1986 | Yokoyama |
| 4,926,134 A | 5/1990 | Olver |
| 6,329,876 B1 | 12/2001 | Llewellyn |

(Continued)

OTHER PUBLICATIONS

Matsukawa, "A 10 MHz BW 50 fJ/conv. Continuous Time Delta-Sigma Modulator with High-order Single Opamp Integrator using Optimization-based Design Method", 2012 Symposium on VLSI Circuits Digest of Technical Papers.

(Continued)

*Primary Examiner* — Brian Young
(74) *Attorney, Agent, or Firm* — Winston Hsu

(57) ABSTRACT

A circuit includes a first amplifying stage, a noise extraction circuit and a noise cancellation circuit. The first amplifying stage is arranged for receiving an input signal to generate an amplified input signal. The noise extraction circuit is coupled to the first amplifying stage, and is arranged for receiving at least the amplified input signal to generate a noise signal associated with noise components of the amplified input signal. The noise cancellation circuit is coupled to the first amplifying stage and the noise extraction circuit, and is arranged for cancelling noise components of the amplified input signal by using the noise signal generated by the noise extraction circuit, to generate a noise-cancelled amplified input signal.

37 Claims, 6 Drawing Sheets

(56) References Cited

U.S. PATENT DOCUMENTS

| | | |
|---|---|---|
| 6,731,165 B1 | 5/2004 | Marz |
| 7,269,237 B2 * | 9/2007 | Taira .................. G10L 19/005 |
| | | 375/346 |
| 8,193,845 B2 * | 6/2012 | Jian .................... H03L 7/1976 |
| | | 327/147 |
| 8,390,495 B2 * | 3/2013 | Shabra ................ H03M 3/326 |
| | | 341/118 |
| 2002/0097090 A1 | 7/2002 | Smedegaard-Pedersen |
| 2005/0012550 A1 | 1/2005 | Posner |

OTHER PUBLICATIONS

Billa, "A 280uW 24kHz-BW 98.5dB-SNDR Chopped Single-Bit CT Delta-Sigma-M Achieving <10Hz 1/f Noise Corner Without Chopping Artifacts", 2016 IEEE International Solid-State Circuits Conference.

* cited by examiner

US 9,929,742 B2

FEED-FORWARD OPERATIONAL AMPLIFIER NOISE CANCELLATION TECHNIQUE AND ASSOCIATED FILTER AND DELTA-SIGMA MODULATOR

CROSS REFERENCE TO RELATED APPLICATIONS

This application claims the priority of U.S. Provisional Application No. 62/375,921, filed on Aug. 17, 2016, which is included herein by reference in its entirety.

BACKGROUND

Base-band receiver noise is always dominated by a channel selecting filter with embedded programmable gain amplifier (PGA) function. To alleviate a dynamic requirement of a backend analog-to-digital converter (ADC), a blocker rejection is conventionally designed to be second or third order. However, the noise reduction is always compromised with the operational amplifier stability in a power inefficient manner, especially in the receiver sensitivity test.

For a continuous time delta-sigma modulator, even if quantization noise can be eliminated by noise coupling or high oversampling ratio, circuit noise is still troublesome because of low efficiency of noise reduction. Generally, large circuit size and high operating current are common solutions to alleviate this problem. However, these common solutions need more manufacturing cost or power consumption.

SUMMARY

It is therefore an objective of the present invention to provide an operational amplifier noise cancellation technique, which uses a noise extraction circuit to inject the noise to the backend amplifying stages to cancel the noise components from previous operational amplifier. By using the noise cancellation technique of the present invention, the design flexibility is high to optimize the noise, current and the operational amplifier stability. In addition, the noise extraction circuit only uses small chip area to reduce the manufacturing cost and power consumption.

According to one embodiment of the present invention, a circuit comprises a first amplifying stage, a noise extraction circuit and a noise cancellation circuit. The first amplifying stage is arranged for receiving an input signal to generate an amplified input signal. The noise extraction circuit is coupled to the first amplifying stage, and is arranged for receiving at least the amplified input signal to generate a noise signal associated with noise components of the amplified input signal. Besides, the input signal is also coupled to the noise extraction circuit to remove the amplified input signal. The noise cancellation circuit is coupled to the first amplifying stage and the noise extraction circuit, and is arranged for cancelling noise components of the amplified input signal by using the noise signal generated by the noise extraction circuit, to generate a noise-cancelled amplified input signal.

According to another embodiment of the present invention, a filter comprises a first amplifying stage, a noise extraction circuit and a noise cancellation circuit. The first amplifying stage is arranged for receiving an input signal to generate an amplified input signal. The noise extraction circuit is coupled to the first amplifying stage, and is arranged for receiving at least the amplified input signal to generate a noise signal associated with noise components of the amplified input signal. Besides, the input signal is also coupled to the noise extraction circuit to remove the amplified input signal. The noise cancellation circuit is coupled to the first amplifying stage and the noise extraction circuit, and is arranged for cancelling noise components of the amplified input signal by using the noise signal generated by the noise extraction circuit, to generate a noise-cancelled amplified input signal.

According to another embodiment of the present invention, a delta-sigma modulator comprises a receiving circuit, a loop filter, a quantizer and a feedback circuit. The receiving circuit is arranged for receiving an input signal and a feedback signal to generate a subtraction signal. The loop filter is coupled to the receiving circuit, and is arranged for receiving the subtraction signal to generate a filtered subtraction signal. The quantizer is coupled to the loop filter, and is arranged for generating a digital output signal according to the filtered subtraction signal. The feedback circuit is arranged for receiving the digital output signal to generate the feedback signal. In addition, the loop filter comprises a first amplifying stage, a noise extraction circuit and a noise cancellation circuit. The first amplifying stage is arranged for receiving the subtraction signal to generate an amplified subtraction signal. The noise extraction circuit is coupled to the first amplifying stage, and is arranged for receiving at least the amplified subtraction signal to generate a noise signal associated with noise components of the amplified subtraction signal. Besides, the subtraction signal from the difference between input signal and feedback one is extracted inside the first amplifying stage and also coupled to the noise extraction circuit to remove the amplified subtraction signal. The noise cancellation circuit is coupled to the first amplifying stage and the noise extraction circuit, and is arranged for cancelling noise components of the amplified subtraction signal by using the noise signal generated by the noise extraction circuit, to generate a noise-cancelled amplified subtraction signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ". The terms "couple" and "couples" are intended to mean either an indirect or a direct electrical connection. Thus, if a first device couples to a second device, that connection may be through a direct electrical connection, or through an indirect electrical connection via other devices and connections.

Figure 1:
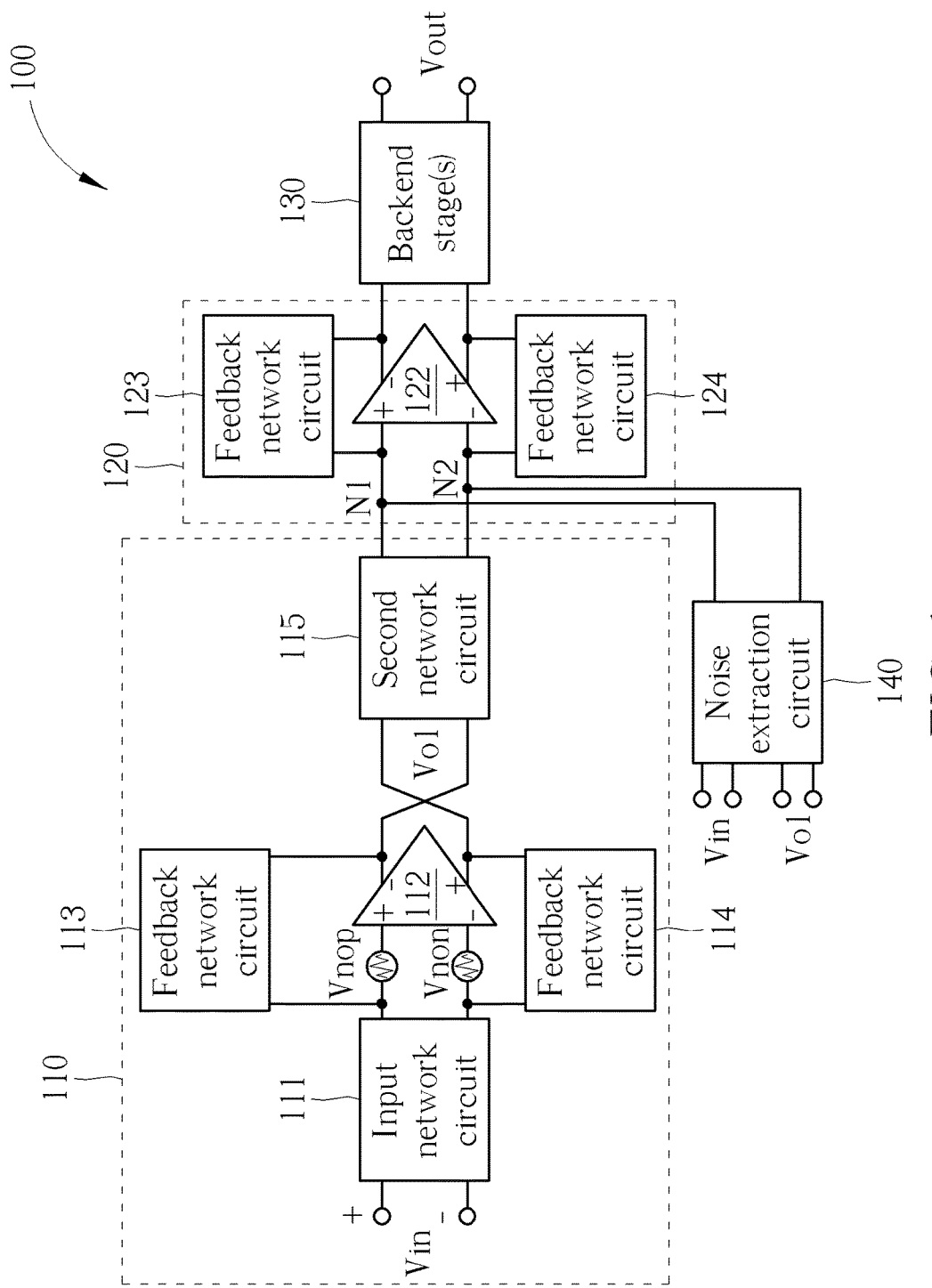
FIG. 1 is a diagram illustrating a filter with programmable gain amplifier function according to one embodiment of the present invention.

FIG. 1 is a diagram illustrating a filter 100 with programmable gain amplifier function according to one embodiment of the present invention. As shown in FIG. 1, the filter 100 comprises a first amplifying stage 110, a second amplifying stage 120, one or more backend stages 130 and a noise extraction circuit 140. The first amplifying stage 110 comprises an input network circuit 111, an operational amplifier 112, two feedback network circuits 113 and 114, and a second network circuit 115, where the operational amplifier 112 receives an input signal Vin via the input network circuit 110 to generate an amplified input signal Vo1, the feedback network circuit 113 is coupled between a positive input terminal and a negative output terminal of the operational amplifier 112, the feedback network circuit 114 is coupled between a negative input terminal and a positive output terminal of the operational amplifier 112, and the amplified input signal Vo1 is transmitted to the second amplifying stage 120 via the second network circuit 115. The second amplifying stage 120 comprises an operational amplifier 122 and two feedback network circuits 123 and 124, where the feedback network circuit 123 is coupled between a positive input terminal and a negative output terminal of the operational amplifier 122, the feedback network circuit 124 is coupled between a negative input terminal and a positive output terminal of the operational amplifier 122.

Because of noise components of the input signal Vin and noise components Vnop and Vnon contributed by the operational amplifier 112, the amplified input signal Vo1 may have obvious noise components. The input signal Vin is coupled to the noise extraction circuit 140 to remove the amplified input signal Vo1 at the output of the noise extraction circuit 140. To cancel or alleviate the noise components without influencing signal components of the amplified input signal Vo1, the noise extraction circuit 140 provides a noise signal that is equivalent to the noise components of the amplified input signal Vo1, and a noise cancellation circuit (which is implemented by nodes N1 and N2 shown in FIG. 1) cancels or alleviates the noise components of the amplified input signal Vo1 by using the noise signal generated by the noise extraction circuit 140, to generate a noise-cancelled amplified input signal. Then, the noise-cancelled amplified input signal is processed by the second amplifying stage 120 and the backend stages 130 to generate an output signal Vout.

In this embodiment, the noise signal generated by the noise extraction circuit 140 is a current signal, and the amplified input signal Vo1 is transformed to be current signals by using the second network circuit 115. Therefore, the noise-cancelled amplified input signal can be simply obtained by using the nodes N1 and N2 to combine the amplified input signal Vo1 and the noise signal.

Figure 2:
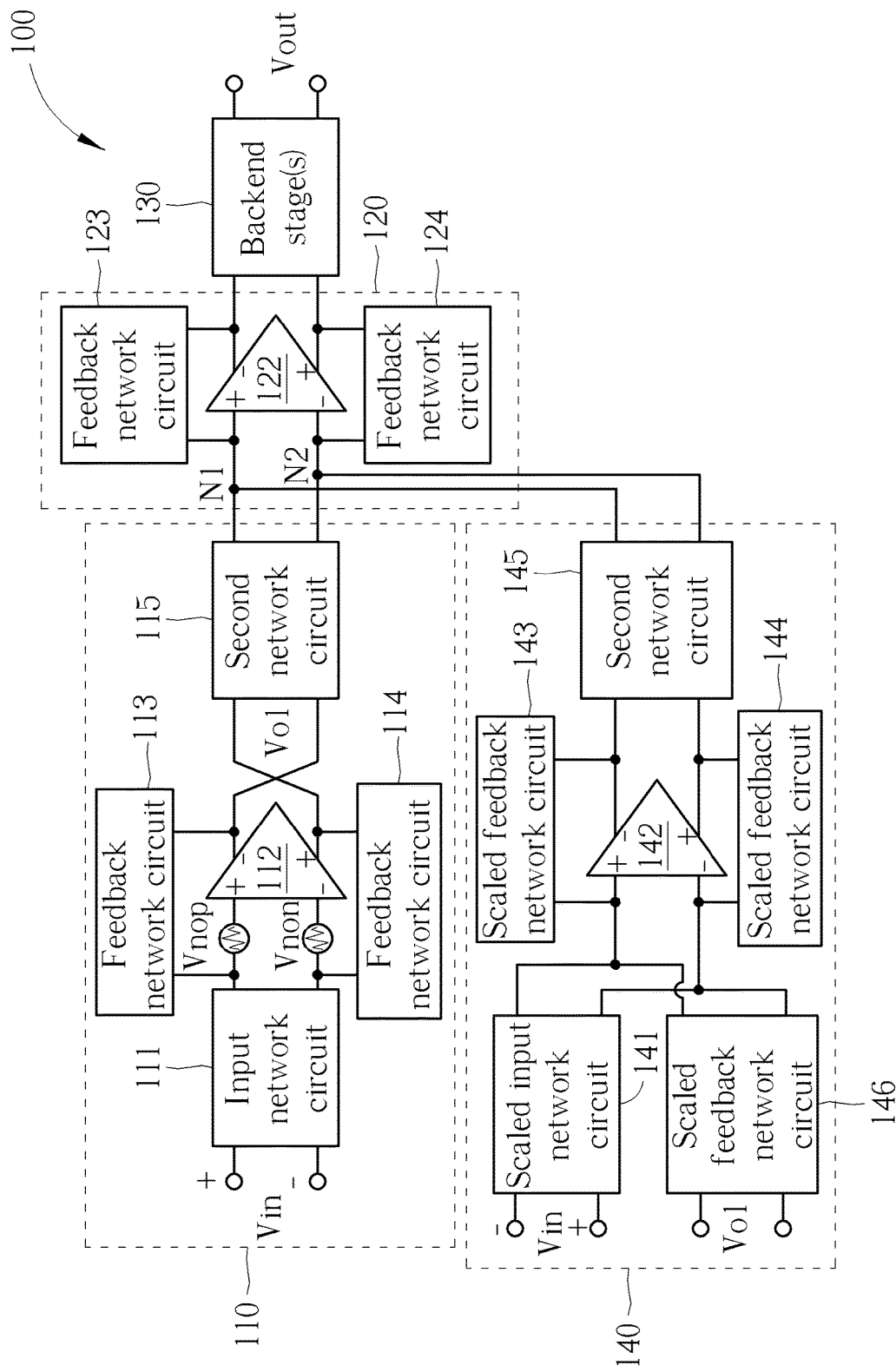
FIG. 2 shows an example of the noise extraction circuit shown in FIG. 1.

FIG. 2 shows an example of the noise extraction circuit 140. In the embodiment shown in FIG. 2, the noise extraction circuit 140 comprises a scaled input network circuit 141, an auxiliary operational amplifier 142, three scaled feedback network circuits 143, 144 and 146, and a second network circuit 145. The scaled input network circuit 141 and the scaled feedback network circuit 146 are coupled between the input signal Vin and the auxiliary operational amplifier 142. The scalded feedback network circuit 143 is coupled between a positive input terminal and a negative output terminal of the auxiliary operational amplifier 142. The scalded feedback network circuit 144 is coupled between a negative input terminal and a positive output terminal of the auxiliary operational amplifier 142. The second network circuit 145 is coupled between the auxiliary operational amplifier 142 and the nodes N1 and N2.

In this embodiment, the circuit blocks of the noise extraction circuit 140 and the corresponding circuit blocks of the first amplifying stage 110 have the same structure with difference sizes, and their scaling factors are the same. For example, a size of the scaled input network circuit 141 may be one-tenth of a size of the input network circuit 111, a size of the scaled feedback network circuit 143, 144 or 146 may be one-tenth of a size of the feedback network circuit 113 or 114, and a size of the second scaled network circuit 145 is the same as second network circuit 115. Because a gain of the operational amplifier is determined based on a ratio between the feedback network circuit and the input network circuit, by using the aforementioned design, the operational amplifier 112 and the auxiliary operational amplifier 142 have the same transfer function.

Compared with the input network circuit 111, the scaled input network circuit 141 within the noise extraction circuit 140 receives the input signal in an inverse manner. By further using the scaled feedback network circuit 146 to receive the amplified input signal Vo1 to the auxiliary operational amplifier 142, the output of the auxiliary operational amplifier 142 can be exactly the noise components of the amplified input signal Vo1, without containing any signal component of the input signal Vin. By designing the auxiliary operational amplifier 142 not to generate any signal component of the input signal Vin, the noise contributed by the second amplifying stage 120 or other circuits will not go back to the input nodes of the filter 100 via the noise extraction circuit 140, that is a noise level of the input signal Vin will not be influenced by arranging the noise extraction circuit 140 within the filter 100.

In addition, the noise contributed by the second amplifying stage 120 or other circuits may go back to the input nodes of the filter 100 via the first amplifying stage 110. To alleviate this noise, the gain determined by the input network circuit 111 and the feedback network circuit 113/114 is greater than one, and the noise contributed by the second amplifying stage 120 will be attenuated when passing through the first amplifying stage 110.

Figure 3:
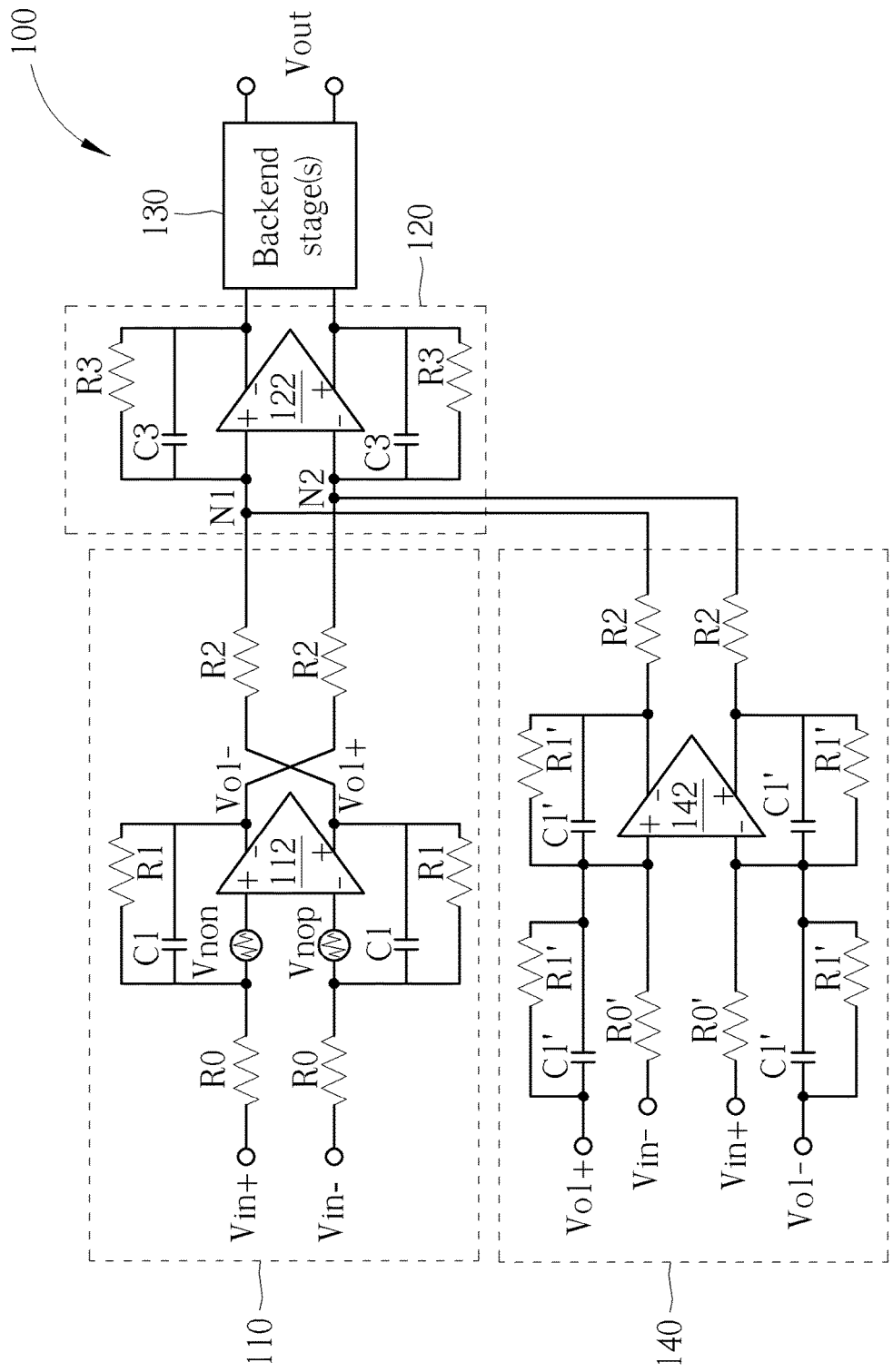
FIG. 3 is a detailed circuit structure of the filter according to one embodiment of the present invention.

FIG. 3 is a detailed circuit structure of the filter 100 according to one embodiment of the present invention. As shown in FIG. 3, for the first amplifying stage 110, the input network circuit 111 is implemented by two resistors R0, the feedback network circuit 113/114 is implemented by a resistor R1 and a capacitor C1, and the second network circuit 115 is implemented by two resistors R2. For the second amplifying stage 120, the feedback network circuit 123/124 is implemented by a resistor R3 and a capacitor C3. For the noise extraction circuit 140, the scaled input network circuit 141 is implemented by two resistors R0', the scaled feedback network circuit 143/144/146 is implemented by a resistor R1' and a capacitor C1', and the second network circuit 145 is implemented by two resistors R2. In this embodiment, the scaling factors for each circuit within the noise extraction circuit 140 and the corresponding circuit within the first amplifying stage 110 are the same. In detail, a ratio between R0 and R0', a ratio between R1 and R1', and a ratio between C1 and C1' are the same (i.e. (R0/R0')=(R1/R1')=(C1/C1')). Furthermore, a resistance of the resistor R1 is designed to be greater than a resistance of the resistor R0 to make the gain of the operational amplifier 112 greater than one, and a resistance of the resistor R1' is designed to be greater than a resistance of the resistor R0' to make the gain of the auxiliary operational amplifier 142 greater than one.

Figure 4:
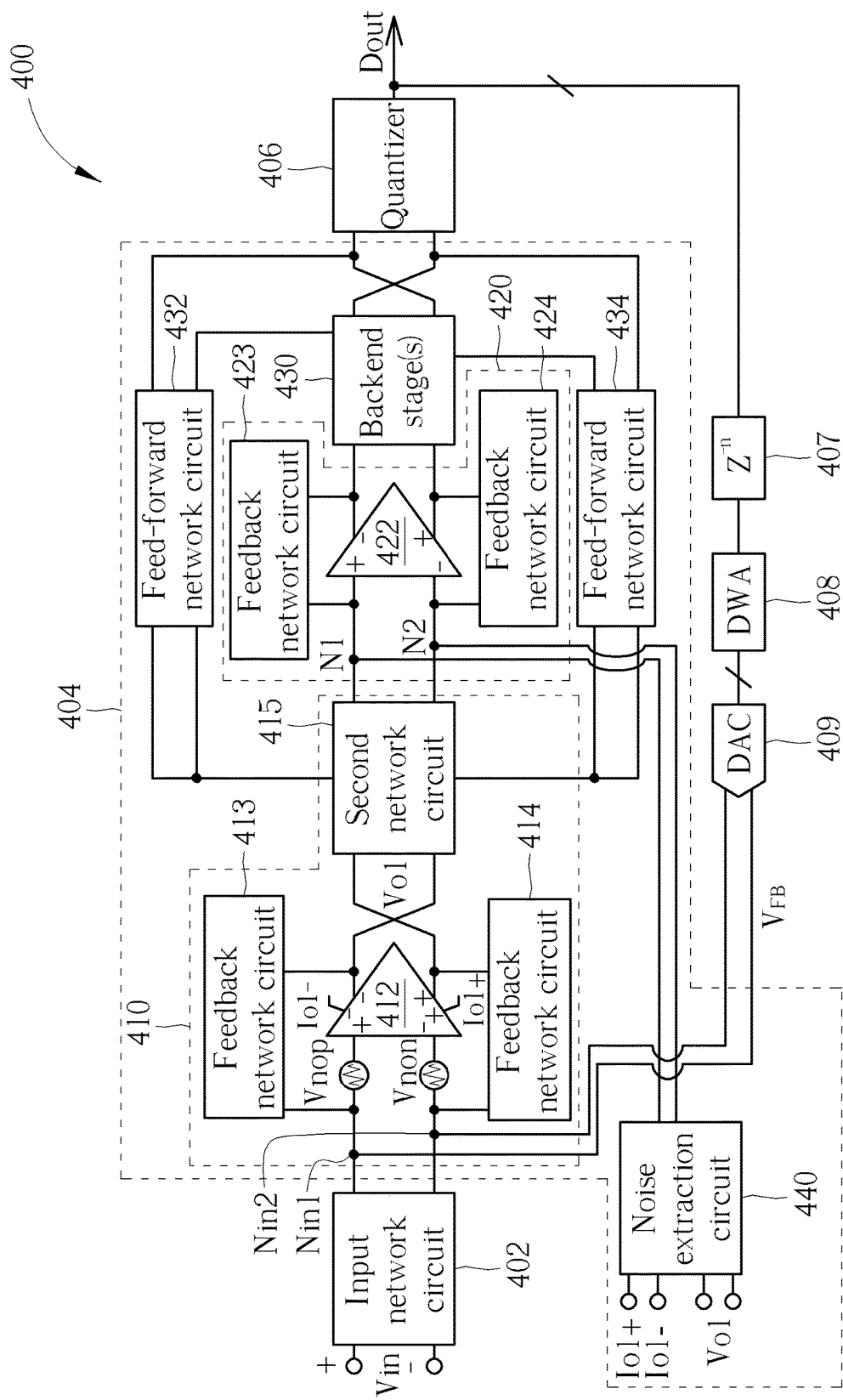
FIG. 4 is a diagram illustrating a delta-sigma modulator with programmable gain amplifier function according to one embodiment of the present invention.

FIG. 4 is a diagram illustrating a delta-sigma modulator 400 according to one embodiment of the present invention, where the delta-sigma modulator 400 is a continuous-time delta-sigma modulator type analog to digital converter (ADC). As shown in FIG. 4, the delta-sigma modulator 400 comprises an input network circuit 402, a receiving circuit implemented by nodes Nin1 and Nin2, a loop filter 404, a quantizer 406, a phase delay/adjusting circuit 407, a data weighted averaging (DWA) circuit 408, and a digital-to-analog converters (DAC) 409.

In the operations of the delta-sigma modulator 400, the receiving circuit Nin1 and Nin2 receive an input signal Vin and a feedback signal $V_{FB}$, and calculates a difference by subtracting the feedback signal $V_{FB}$ by the input signal Vin to generate a subtraction signal. Then, the loop filter 404 filters the subtraction signal to generate a filtered subtraction signal. The quantizer 406 generates a digital output signal Dout according to the filtered subtraction signal. Then, the digital output signal Dout is processed by the phase delay/adjusting circuit 160, the DWA circuit 408, and the DAC 409 to generate the feedback signal $V_{FB}$ to the receiving circuit Nin1 and Nin2.

Because the embodiments of the present invention focus on the designs of the loop filter 404, detailed descriptions about the other elements are therefore omitted here.

The loop filter 404 comprises a first amplifying stage 410, a second amplifying stage 420, one or more backend stage(s) 430 and two feed-forward network circuit 432 and 434. The first amplifying stage 410 comprises an operational amplifier 412, two feedback network circuits 413 and 414 and a second network circuit 415, where the operational amplifier 412 receives the subtraction signal (i.e. the difference between the input signal Vin and the feedback signal $V_{FB}$) from the receiving circuit Nin1 and Nin2 to generate an amplified subtraction signal Vo1, the feedback network circuit 143 is coupled between a positive input terminal and a negative output terminal of the operational amplifier 412, the feedback network circuit 414 is coupled between a negative input terminal and a positive output terminal of the operational amplifier 412, and the amplified subtraction signal Vo1 is transmitted to the second amplifying stage 420 via the second network circuit 415. The second amplifying stage 420 comprises an operational amplifier 422 and two feedback network circuits 423 and 424, where the feedback network circuit 423 is coupled between a positive input terminal and a negative output terminal of the operational amplifier 422, the feedback network circuit 424 is coupled between a negative input terminal and a positive output terminal of the operational amplifier 422. The feed-forward network circuits 432 and 434 are coupled between the second network circuit 415, the backend stages 430 and an output of the loop filter 404.

Because of noise components of the input signal Vin and noise components Vnop and Vnon contributed by the operational amplifier 412, the amplified subtraction signal Vo1 may have obvious noise components. Besides, the subtraction signal from the difference between input signal Vin and feedback one $V_{FB}$ is extracted inside the operational amplifier 412 and also coupled to the noise extraction circuit 440 to remove the amplified subtraction signal. To cancel or alleviate the noise components without influencing signal components of the amplified subtraction signal Vo1, the noise extraction circuit 440 provides a noise signal that is equivalent to the noise components of the amplified subtraction signal Vo1, and a noise cancellation circuit (which is implemented by nodes N1 and N2 shown in FIG. 4) cancels or alleviates the noise components of the amplified subtraction signal Vo1 by using the noise signal generated by the noise extraction circuit 440, to generate a noise-cancelled amplified subtraction signal. Then, the noise-cancelled amplified input signal is processed by the second amplifying stage 440, the backend stages 430 and the quantizer 406 to generate the digital output signal Dout.

In this embodiment, the noise signal generated by the noise extraction circuit 440 is a current signal, and the amplified subtraction signal Vo1 is transformed to be current signals by using the second network circuit 415. Therefore, the noise-cancelled amplified subtraction signal can be simply obtained by using the nodes N1 and N2 to combine the amplified subtraction signal Vo1 and the noise signal.

Figure 5:
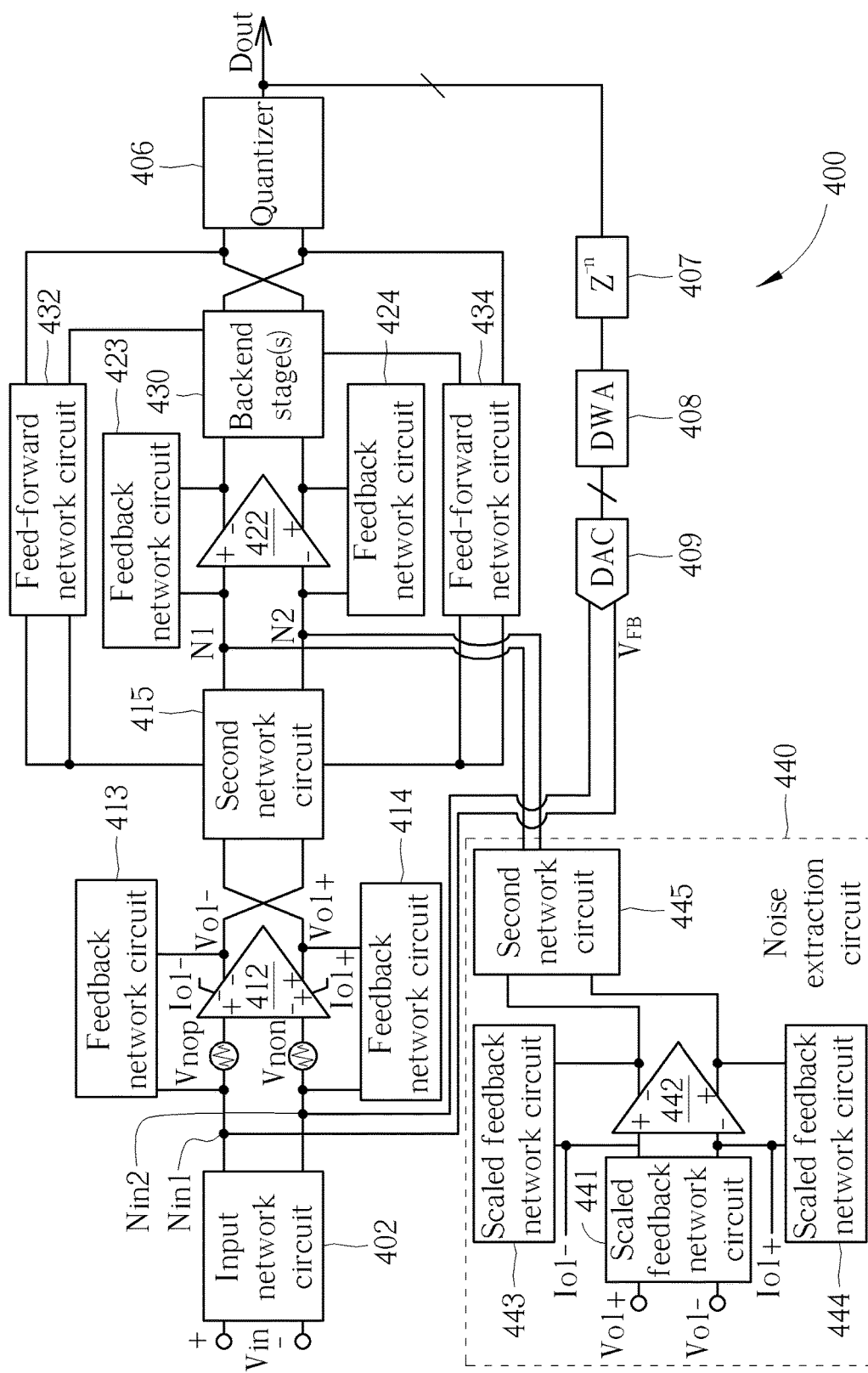
FIG. 5 shows an example of the noise extraction circuit shown in FIG. 4.

FIG. 5 shows an example of the noise extraction circuit 440. In the embodiment shown in FIG. 5, the noise extraction circuit 440 comprises an auxiliary operational amplifier 442, three scaled feedback network circuits 441, 443, and 444, and a second network circuit 445. The scaled feedback network circuit 441 are coupled between the amplified subtraction signal Vo1 and the auxiliary operational amplifier 442. The scalded feedback network circuit 443 is coupled between a positive input terminal and a negative output terminal of the auxiliary operational amplifier 442. The scalded feedback network circuit 444 is coupled between a negative input terminal and a positive output terminal of the auxiliary operational amplifier 442. The second network circuit 445 is coupled between the auxiliary operational amplifier 442 and the nodes N1 and N2.

In this embodiment, the circuit blocks of the noise extraction circuit 440 and the corresponding circuit blocks of the first amplifying stage 410 have the same structure with difference sizes, and their scaling factors are the same. For example, a size of the scaled feedback network circuit 441, 443 or 444 may be one-tenth of a size of the feedback network circuit 413 or 414, and a size of the second scaled network circuit 445 may also be one-tenth of a size of the second network circuit 415. Because a gain of the operational amplifier is determined based on a ratio between the feedback network circuit and the input network circuit, by using the aforementioned design, the operational amplifier 412 and the auxiliary operational amplifier 442 have the same transfer function.

The subtraction signal generated by the receiving circuit Nin1 and Nin2 is a differential pair, the amplified subtraction signal Vo1 generated by the operational amplifier 412 is also a differential pair comprising Vo1+ and Vo1−. In addition, the operational amplifier 412 also generates two current signals Io1+ and Io1−, where the current signal Io1+ is extracted from one of the subtraction signal pair, or the current signal Io1+ may be obtained from the subtraction signal pair (this current obtained from a current flowing through the feedback network circuit 414 with the scaling factor equal to that of the scaled feedback network circuit 444); and the current signal Io1− is extracted from the other one of the subtraction signal pair, or the current signal Io1− may be obtained from the other one of the subtraction signal pair (this current obtained from a current flowing through the feedback network circuit 413 with the scaling factor equal to that of the scaled feedback network circuit 443).

In the noise extraction circuit 440, the positive input terminal of the auxiliary operational amplifier 442 is coupled to the current signal Io1− and the subtraction signal Vo1+, and the negative input terminal of the auxiliary operational amplifier 442 is coupled to the current signal Io1+ and the subtraction signal Vo1−, and the scaled feedback network circuit 441, 443 or 444 are the same. By using the noise extraction circuit 440 shown in FIG. 4, the output of the auxiliary operational amplifier 442 can be exactly the same as noise components of the amplified subtraction signal Vo1, without containing any signal component of the input signal Vin or the subtraction signal. By designing the auxiliary operational amplifier 442 not to generate any signal component of the input signal Vin or the subtraction signal, the noise contributed by the second amplifying stage 420 or other circuits will not go back to the input nodes of the delta-sigma modulator 400 via the noise extraction circuit 440, that is a noise level of the input signal Vin will not be influenced by arranging the noise extraction circuit 440 delta-sigma modulator 400.

In addition, the noise contributed by the second amplifying stage 420 or other circuits may go back to the input nodes of the delta-sigma modulator 400 via the first amplifying stage 410. To alleviate this noise, the gain of operational amplifier 412 is greater than one, and the noise contributed by the second amplifying stage 420 will be attenuated when passing through the first amplifying stage 410.

Figure 6:
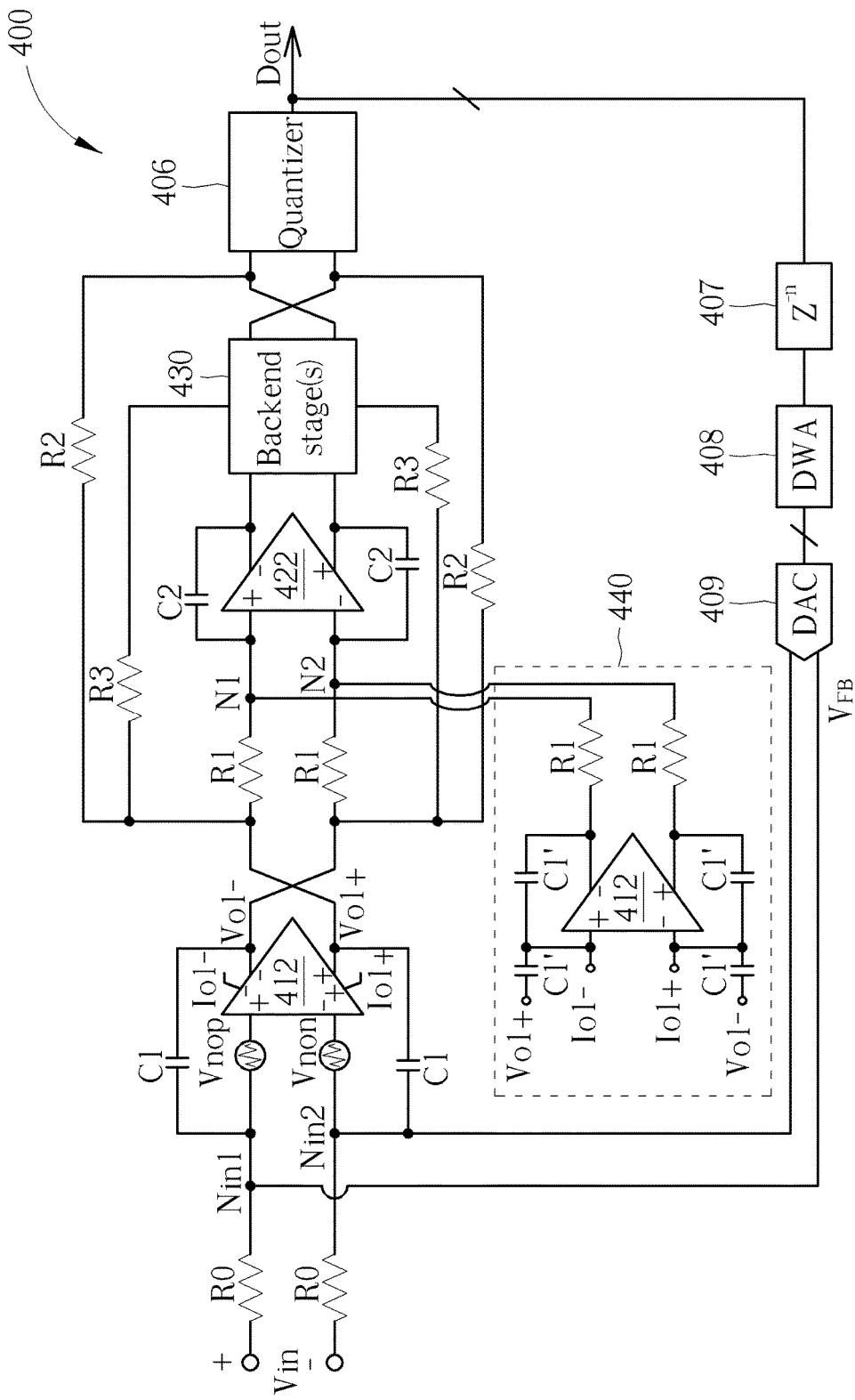
FIG. 6 is a detailed circuit structure of the delta-sigma modulator according to one embodiment of the present invention.

FIG. 6 is a detailed circuit structure of the delta-sigma modulator 400 according to one embodiment of the present invention. As shown in FIG. 6, the input network circuit 402 is implemented by two resistors R0. For the first amplifying stage 410, the feedback network circuit 413/414 is implemented by a capacitor C1, and a second network circuit 415 is implemented by two resistors R1. For the second amplifying stage 420, the feedback network circuit 423/424 is implemented by a capacitor C2. For the noise extraction circuit 440, the scaled feedback network circuit 441/443/444 is implemented by a capacitor C1', and a second network circuit 445 is implemented by two resistors R1. The feed-forward network circuit 432/434 is implemented by resistors R2 and R3. In this embodiment, the scaling factors for each circuit within the noise extraction circuit 440 and the corresponding circuit within the first amplifying stage 410 are the same. In detail, a ratio between C1 and C1' in scaled feedback network 441/443/444 is the same. Furthermore, because both the first amplifying stage 410 and the noise extraction circuit are an integrator, their gain are much greater than one.

Briefly summarized, in the Feed-forward operational amplifier noise cancellation technique of the present invention, a noise extraction circuit is used to obtain the noise components of the output of the first amplifying stage, and the noise signal generated by the noise extraction circuit is forwarded to the input of the second amplifying stage to cancel or alleviate the noise components of the output of the first amplifying stage (or alleviate the noise components of the second amplifying stage). In addition, the noise extraction circuit has a smaller chip area to save the manufacturing cost, and the noise extraction circuit is designed to not generate any signal component to prevent the noise contributed by the second amplifying stage from going back to the input node. Therefore, the circuit of the present invention can effectively lower the noise without increasing too much chip area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit, comprising:
   a first amplifying stage, for receiving an input signal to generate an amplified input signal;
   a noise extraction circuit, coupled to the first amplifying stage, for receiving at least the amplified input signal to generate a noise signal associated with noise components of the amplified input signal, wherein the noise extraction circuit does not generate a signal component of the input signal or the amplified input signal; and
   a noise cancellation circuit, coupled to the first amplifying stage and the noise extraction circuit, for cancelling noise components of the amplified input signal by using the noise signal generated by the noise extraction circuit, to generate a noise-cancelled amplified input signal.

2. The circuit of claim 1, wherein the noise extraction circuit generates the noise signal that is equivalent to the noise components of the amplified input signal.

3. The circuit of claim 1, wherein the amplified input signal and the noise signal are current signals, and the circuit further comprising:
   a second amplifying stage, wherein the second amplifying stage comprises an operational amplifier, and input nodes of the operational amplifier receives the amplified input signal and the noise signal to obtain the noise-cancelled amplified input signal.

4. The circuit of claim 1, wherein a gain of the first amplifying stage is greater than one.

5. The circuit of claim 1, wherein noise extraction circuit receives the input signal and the amplified input signal to generate a noise signal, and the first amplifying stage comprises:
   an operational amplifier;
   an input network circuit, wherein the operational amplifier receives the input signal via the input network circuit; and
   a feedback network circuit, coupled between input terminals and output terminals of the operational amplifier; and
   the noise extraction circuit comprises:
   an auxiliary operational amplifier;
   a scaled input network circuit, wherein the auxiliary operational amplifier receives the input signal via the scaled input network circuit;
   a first scaled feedback network circuit, coupled between input terminals and output terminals of the auxiliary operational amplifier; and
   a second scaled feedback network circuit, wherein the auxiliary operational amplifier receives the amplified input signal via the second scaled feedback network circuit.

6. The circuit of claim 5, wherein the auxiliary input network circuit and the input network circuit have same circuit structure with different sizes, and the first auxiliary feedback network circuit and the feedback network circuit have same circuit structure with different sizes.

7. The circuit of claim 6, wherein a size ratio between the input network circuit and the auxiliary input network circuit is the same as a size ratio between the feedback network circuit and the first auxiliary feedback network circuit.

8. The circuit of claim 5, wherein the first auxiliary feedback network circuit and the second auxiliary feedback network circuit are the same.

9. The circuit of claim 5, wherein the input signal comprises a first input signal and a second input signal serving as a differential pair, the first input signal is inputted into a positive input terminal of the operational amplifier, and the second input signal is inputted into a negative input terminal of the operational amplifier via the input network circuit; and the first input signal is inputted into a negative input terminal of the auxiliary operational amplifier, and the second input signal is inputted into a positive input terminal of the auxiliary operational amplifier via the auxiliary input network circuit.

10. The circuit of claim 9, wherein the amplified input signal comprises an amplified first input signal and an amplified second input signal, the amplified first input signal is inputted into the positive input terminal of the auxiliary operational amplifier, and the amplified second input signal is inputted into the negative input terminal of the auxiliary operational amplifier via the second auxiliary feedback network circuit.

11. The circuit of claim 5, wherein the circuit is applied to a filter with programmable gain amplifier.

12. The circuit of claim 1, wherein noise extraction circuit a current signal extracted from the input signal and the amplified input signal to generate a noise signal, and the first amplifying stage comprises:
an operational amplifier, for receiving the input signal;
a feedback network circuit, coupled between input terminals and output terminals of the operational amplifier; and
the noise extraction circuit comprises:
an auxiliary operational amplifier;
a first scaled feedback network circuit, coupled between input terminals and output terminals of the auxiliary operational amplifier; and
a second scaled feedback network circuit, wherein the auxiliary operational amplifier receives the current signal via the second scaled feedback network circuit.

13. The circuit of claim 12, wherein the auxiliary input network circuit and the input network circuit have same circuit structure with different sizes, and the first auxiliary feedback network circuit and the feedback network circuit have same circuit structure with different sizes.

14. The circuit of claim 12, wherein the first auxiliary feedback network circuit and the second auxiliary feedback network circuit are the same.

15. The circuit of claim 12, wherein the circuit is applied to a delta-sigma modulator.

16. A filter with programmable gain amplifier, comprising:
a first amplifying stage, for receiving an input signal to generate an amplified input signal;
a noise extraction circuit, coupled to the first amplifying stage, for receiving at least the amplified input signal to generate a noise signal associated with noise components of the amplified input signal; and
a noise cancellation circuit, coupled to the first amplifying stage and the noise extraction circuit, for cancelling noise components of the amplified input signal by using the noise signal generated by the noise extraction circuit, to generate a noise-cancelled amplified input signal.

17. The filter of claim 16, wherein the noise extraction circuit generates the noise signal that is equivalent to the noise components of the amplified input signal, and the noise extraction circuit does not generate signal components of the input signal or the amplified input signal.

18. A delta-sigma modulator, comprising:
a receiving circuit, for receiving an input signal and a feedback signal to generate a subtraction signal;
a loop filter, coupled to the receiving circuit, for receiving the subtraction signal to generate a filtered subtraction signal;
a quantizer, coupled to the loop filter, for generating a digital output signal according to the filtered subtraction signal; and
a feedback circuit, for receiving the digital output signal to generate the feedback signal;
wherein the loop filter comprises:
a first amplifying stage, for receiving the subtraction signal to generate an amplified subtraction signal;
a noise extraction circuit, coupled to the first amplifying stage, for receiving at least the amplified subtraction signal to generate a noise signal associated with noise components of the amplified subtraction signal; and
a noise cancellation circuit, coupled to the first amplifying stage and the noise extraction circuit, for cancelling noise components of the amplified subtraction signal by using the noise signal generated by the noise extraction circuit, to generate a noise-cancelled amplified input signal.

19. The delta-sigma modulator of claim 18, wherein the noise extraction circuit generates the noise signal that is equivalent to the noise components of the amplified input signal, and the noise extraction circuit does not generate any signal component of the input signal or the amplified input signal.

20. A circuit, comprising:
a first amplifying stage, for receiving an input signal to generate an amplified input signal;
a noise extraction circuit, coupled to the first amplifying stage, for receiving at least the amplified input signal to generate only a noise signal associated with noise components of the amplified input signal; and
a noise cancellation circuit, coupled to the first amplifying stage and the noise extraction circuit, for cancelling noise components of the amplified input signal by combining the amplified input signal within the noise signal generated by the noise extraction circuit, to generate a noise-cancelled amplified input signal.

21. The circuit of claim 20, wherein the noise extraction circuit generates the noise signal that is equivalent to the noise components of the amplified input signal, and the noise extraction circuit does not generate signal components of the input signal or the amplified input signal.

22. The circuit of claim 20, wherein the amplified input signal and the noise signal are current signals, and the circuit further comprising:
a second amplifying stage, wherein the second amplifying stage comprises an operational amplifier, and input nodes of the operational amplifier receives the amplified input signal and the noise signal to obtain the noise-cancelled amplified input signal.

23. The circuit of claim 20, wherein a gain of the first amplifying stage is greater than one.

24. A circuit, comprising:
a first amplifying stage, for receiving an input signal to generate an amplified input signal;
a noise extraction circuit, coupled to the first amplifying stage, for receiving at least the amplified input signal to generate a noise signal associated with noise components of the amplified input signal;
a noise cancellation circuit, coupled to the first amplifying stage and the noise extraction circuit, for cancelling noise components of the amplified input signal by using the noise signal generated by the noise extraction circuit, to generate a noise-cancelled amplified input signal; and
a second amplifying stage, wherein the second amplifying stage comprises an operational amplifier, and input nodes of the operational amplifier receives the amplified input signal and the noise signal to obtain the noise-cancelled amplified input signal
wherein the amplified input signal and the noise signal are current signals.

25. The circuit of claim 24, wherein the noise extraction circuit generates the noise signal that is equivalent to the noise components of the amplified input signal, and the noise extraction circuit does not generate signal components of the input signal or the amplified input signal.

26. The circuit of claim 24, wherein a gain of the first amplifying stage is greater than one.

27. A circuit, comprising:
a first amplifying stage, for receiving an input signal to generate an amplified input signal;
a noise extraction circuit, coupled to the first amplifying stage, for receiving at least the amplified input signal to generate a noise signal associated with noise components of the amplified input signal; and
a noise cancellation circuit, coupled to the first amplifying stage and the noise extraction circuit, for cancelling noise components of the amplified input signal by using the noise signal generated by the noise extraction circuit, to generate a noise-cancelled amplified input signal;
wherein a gain of the first amplifying stage is greater than one.

28. The circuit of claim 27, wherein the noise extraction circuit generates the noise signal that is equivalent to the noise components of the amplified input signal, and the noise extraction circuit does not generate signal components of the input signal or the amplified input signal.

29. The circuit of claim 27, wherein the amplified input signal and the noise signal are current signals, and the circuit further comprising:
a second amplifying stage, wherein the second amplifying stage comprises an operational amplifier, and input nodes of the operational amplifier receives the amplified input signal and the noise signal to obtain the noise-cancelled amplified input signal.

30. A circuit, comprising:
a first amplifying stage, for receiving an input signal to generate an amplified input signal;
a noise extraction circuit, coupled to the first amplifying stage, for receiving at least the amplified input signal to generate a noise signal associated with noise components of the amplified input signal; and
a noise cancellation circuit, coupled to the first amplifying stage and the noise extraction circuit, for cancelling noise components of the amplified input signal by using the noise signal generated by the noise extraction circuit, to generate a noise-cancelled amplified input signal;
wherein noise extraction circuit receives the input signal and the amplified input signal to generate a noise signal, and the first amplifying stage comprises:
an operational amplifier;
an input network circuit, wherein the operational amplifier receives the input signal via the input network circuit; and
a feedback network circuit, coupled between input terminals and output terminals of the operational amplifier; and
the noise extraction circuit comprises:
an auxiliary operational amplifier;
a scaled input network circuit, wherein the auxiliary operational amplifier receives the input signal via the scaled input network circuit;
a first scaled feedback network circuit, coupled between input terminals and output terminals of the auxiliary operational amplifier; and
a second scaled feedback network circuit, wherein the auxiliary operational amplifier receives the amplified input signal via the second scaled feedback network circuit.

31. The circuit of claim 30, wherein the noise extraction circuit generates the noise signal that is equivalent to the noise components of the amplified input signal, and the noise extraction circuit does not generate signal components of the input signal or the amplified input signal.

32. The circuit of claim 30, wherein the amplified input signal and the noise signal are current signals, and the circuit further comprising:
a second amplifying stage, wherein the second amplifying stage comprises an operational amplifier, and input nodes of the operational amplifier receives the amplified input signal and the noise signal to obtain the noise-cancelled amplified input signal.

33. The circuit of claim 30, wherein a gain of the first amplifying stage is greater than one.

34. A circuit, comprising:
a first amplifying stage, for receiving an input signal to generate an amplified input signal;
a noise extraction circuit, coupled to the first amplifying stage, for receiving at least the amplified input signal to generate a noise signal associated with noise components of the amplified input signal; and
a noise cancellation circuit, coupled to the first amplifying stage and the noise extraction circuit, for cancelling noise components of the amplified input signal by using the noise signal generated by the noise extraction circuit, to generate a noise-cancelled amplified input signal;
wherein noise extraction circuit a current signal extracted from the input signal and the amplified input signal to generate a noise signal, and the first amplifying stage comprises:
an operational amplifier, for receiving the input signal;
a feedback network circuit, coupled between input terminals and output terminals of the operational amplifier; and
the noise extraction circuit comprises:
an auxiliary operational amplifier;
a first scaled feedback network circuit, coupled between input terminals and output terminals of the auxiliary operational amplifier; and
a second scaled feedback network circuit, wherein the auxiliary operational amplifier receives the current signal via the second scaled feedback network circuit.

35. The circuit of claim 34, wherein the noise extraction circuit generates the noise signal that is equivalent to the noise components of the amplified input signal, and the noise extraction circuit does not generate signal components of the input signal or the amplified input signal.

36. The circuit of claim 34, wherein the amplified input signal and the noise signal are current signals, and the circuit further comprising:
- a second amplifying stage, wherein the second amplifying stage comprises an operational amplifier, and input nodes of the operational amplifier receives the amplified input signal and the noise signal to obtain the noise-cancelled amplified input signal.

37. The circuit of claim 34, wherein a gain of the first amplifying stage is greater than one.

* * * * *